(12) United States Patent
Omata et al.

(10) Patent No.: US 7,355,220 B2
(45) Date of Patent: Apr. 8, 2008

(54) ARRAY SUBSTRATE

(75) Inventors: Kazuyoshi Omata, Fukaya (JP); Makoto Shibusawa, Fukaya (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 177 days.

(21) Appl. No.: 11/389,074

(22) Filed: Mar. 27, 2006

(65) Prior Publication Data

US 2006/0220580 A1    Oct. 5, 2006

(30) Foreign Application Priority Data

| Mar. 31, 2005 | (JP) | ............................. 2005-104647 |
| Mar. 31, 2005 | (JP) | ............................. 2005-105096 |
| Mar. 31, 2005 | (JP) | ............................. 2005-105098 |

(51) Int. Cl.
  *H01L 33/00* (2006.01)
  *H01L 27/105* (2006.01)
(52) U.S. Cl. ...................... 257/208; 257/390; 257/401; 257/E33.044
(58) Field of Classification Search ................ 257/208, 257/390, 401, E33.044
See application file for complete search history.

(56) References Cited

U.S. PATENT DOCUMENTS

| 6,373,454 B1 | 4/2002 | Knapp et al. |
| 7,009,591 B2 | 3/2006 | Shibusawa |
| 2005/0269961 A1 | 12/2005 | Shibusawa et al. |

FOREIGN PATENT DOCUMENTS

JP    2004-246349    9/2004

*Primary Examiner*—Evan Pert
(74) *Attorney, Agent, or Firm*—Oblon, Spivak, McClelland, Maier & Neustadt, P.C.

(57) ABSTRACT

An array substrate includes an insulating substrate, pixel circuits arranged in a matrix on the insulating substrate, and video signal lines arranged correspondently with columns which the pixel circuits form. Each pixel circuit includes a drive transistor whose source is connected to a power supply terminal, a pixel electrode, an output control switch connected between a drain of the drive transistor and the pixel electrode, a selector switch connected between the drain and the video signal line, a diode-connecting switch including switching elements connected in series between the drain and a gate of the drive transistor, a first capacitor including an electrode connected to the gate, and a second capacitor including an electrode to which two of the switching elements are connected in parallel.

14 Claims, 10 Drawing Sheets

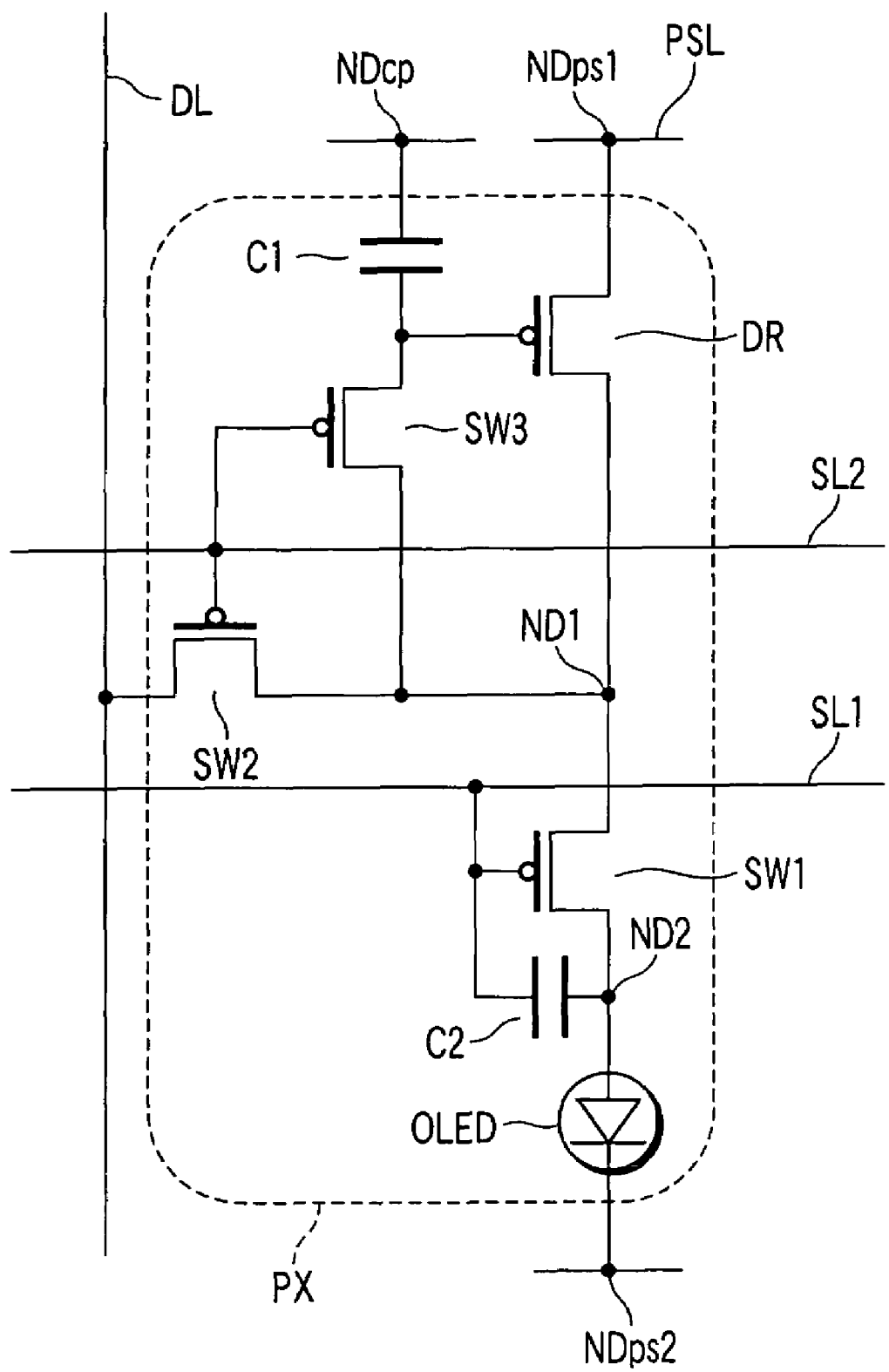
F I G. 9

ARRAY SUBSTRATE

CROSS-REFERENCE TO RELATED APPLICATIONS

This application is based upon and claims the benefit of priority from prior Japanese Patent Applications No. 2005-104647, filed Mar. 31, 2005; No. 2005-105096, filed Mar. 31, 2005; and No. 2005-105098, filed Mar. 31, 2005, the entire contents of all of which are incorporated herein by reference.

BACKGROUND OF THE INVENTION

1. Field of the Invention

The present invention relates to an array substrate that can be used in an active matrix display.

2. Description of the Related Art

U.S. Pat. No. 6,373,454 describes an active matrix organic electroluminescent (EL) display in which each pixel circuit utilizes a current mirror circuit. The pixel circuit includes an n-channel field-effect transistor as a drive transistor, an organic EL element, a capacitor, an output control switch, a selector switch, and a diode-connecting switch.

The source of the drive transistor is connected to a first power supply line at a low potential. The capacitor is connected between the gate of the drive transistor and the first power supply line. The output control switch is connected between the drain of the drive transistor and the cathode of the organic EL element. The anode of the organic EL element is connected to a second power supply line at a higher potential. The selector switch is connected between the drain of the drive transistor and a video signal line. The diode-connecting switch is connected between the drain and gate of the drive transistor. Each of the switches is normally composed of a field-effect transistor.

As typified by the above circuit, each pixel circuit in an active matrix organic EL display includes an organic EL element and a field-effect transistor. In the manufacture of such an organic EL display, the field-effect transistor may suffer electrostatic damage after a pixel electrode is formed and before the organic EL element is completed. The electrostatic damage to the field-effect transistor in a pixel may cause the pixel to be viewed as a luminous dot or a dark dot.

BRIEF SUMMARY OF THE INVENTION

An object of the present invention is to suppress electrostatic damage to a transistor included in each pixel circuit.

According to a first aspect of the present invention, there is provided an array substrate comprising an insulating substrate, pixel circuits arranged in a matrix on the insulating substrate, and video signal lines arranged correspondently with columns which the pixel circuits form, each of the pixel circuits comprising a drive transistor whose source is connected to a power supply terminal, a pixel electrode, an output control switch connected between a drain of the drive transistor and the pixel electrode, a selector switch connected between the drain and the video signal line, a diode-connecting switch including switching elements connected in series between the drain and a gate of the drive transistor, a first capacitor including an electrode connected to the gate, and a second capacitor including a first electrode to which two of the switching elements are connected in parallel.

According to a second aspect of the present invention, there is provided an array substrate comprising an insulating substrate, pixel circuits arranged in a matrix on the insulating substrate, and video signal lines arranged correspondently with columns which the pixel circuits form, each of the pixel circuits comprising a drive transistor whose source is connected to a power supply terminal, a pixel electrode, an output control switch connected between a drain of the drive transistor and the pixel electrode, a selector switch connected between the drain and the video signal line, a diode-connecting switch including switching elements connected in series between the drain and a gate of the drive transistor, and a capacitor including an electrode connected to the gate, wherein, when the array substrate is observed perpendicularly to a main surface of the insulating substrate, a conductive path connecting the drain to the gate of the drive transistor partially overlaps a conductive layer in each of the pixel circuits.

According to a third aspect of the present invention, there is provided an array substrate comprising an insulating substrate, pixel circuits arranged in a matrix on the insulating substrate, and video signal lines arranged correspondently with columns which the pixel circuits form, each of the pixel circuits comprising a drive transistor whose source is connected to a power supply terminal, a pixel electrode, an output control switch connected between a drain of the drive transistor and the pixel electrode and including a switching transistor, a selector switch connected between the drain and the video signal line, a diode-connecting switch connected between the drain and a gate of the drive transistor, a first capacitor including an electrode connected to the gate, and a second capacitor connected between the pixel electrode and a gate of the switching transistor.

According to a fourth aspect of the present invention, there is provided an array substrate comprising an insulating substrate, pixel circuits arranged in a matrix on the insulating substrate, scan signal lines arranged correspondently with rows which the pixel circuits form, and video signal lines arranged correspondently with columns which the pixel circuits form, each of the pixel circuits comprising a drive transistor whose source is connected to a power supply terminal, a pixel electrode, an output control switch connected between a drain of the drive transistor and the pixel electrode and including a switching transistor whose gate is connected to the scan signal line, a selector switch connected between the drain and the video signal line, a diode-connecting switch connected between the drain and a gate of the drive transistor, and a capacitor including an electrode connected to the gate, wherein, when the array substrate is observed perpendicularly to a main surface of the insulating substrate, the pixel electrode partially overlaps the scan signal line in each of the pixel circuits.

BRIEF DESCRIPTION OF THE SEVERAL VIEWS OF THE DRAWING

FIG. 9 is an equivalent circuit diagram of a pixel included in the display shown in FIG. 8.

DETAILED DESCRIPTION OF THE INVENTION

Figure 1:
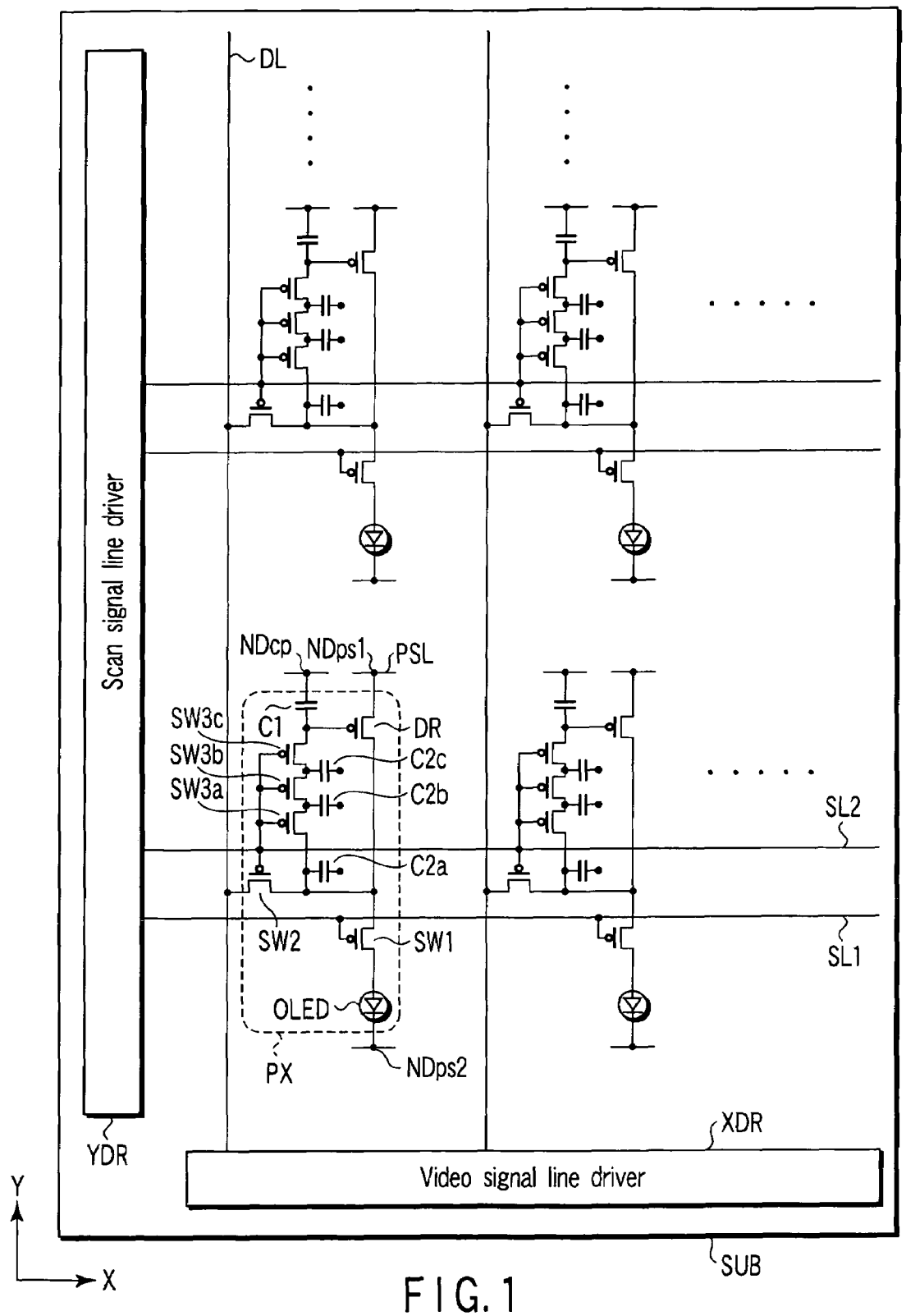
FIG. 1 is a plan view schematically showing an example of a display including an array substrate according to a first embodiment of the present invention.

Embodiments of the present invention will be described below in detail with reference to the drawings. In the drawings, components achieving the same or similar functions are denoted by the same reference numerals and duplicate descriptions will be omitted.

Figure 2:
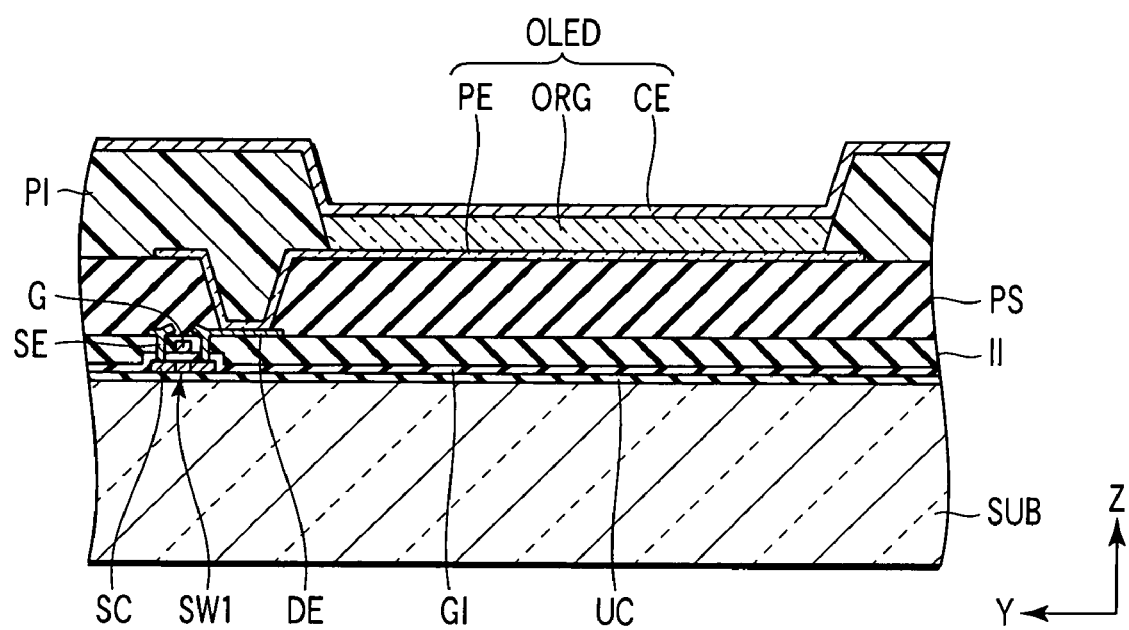
FIG. 2 is a partial sectional view schematically showing an example of a structure that can be used in the display shown in FIG. 1.
Figure 3:
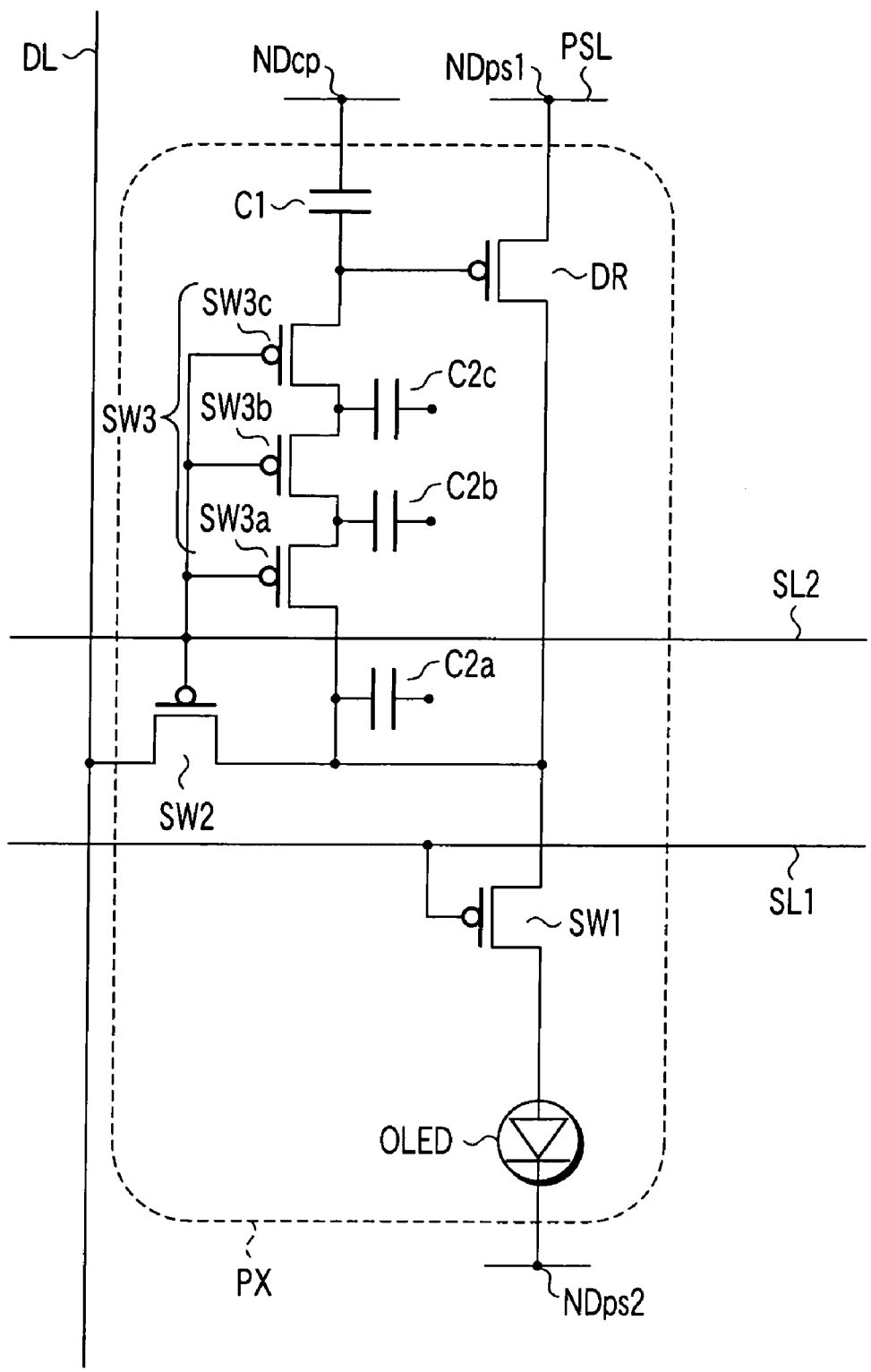
FIG. 3 is an equivalent circuit diagram of a pixel included in the display shown in FIG. 1.
Figure 4:
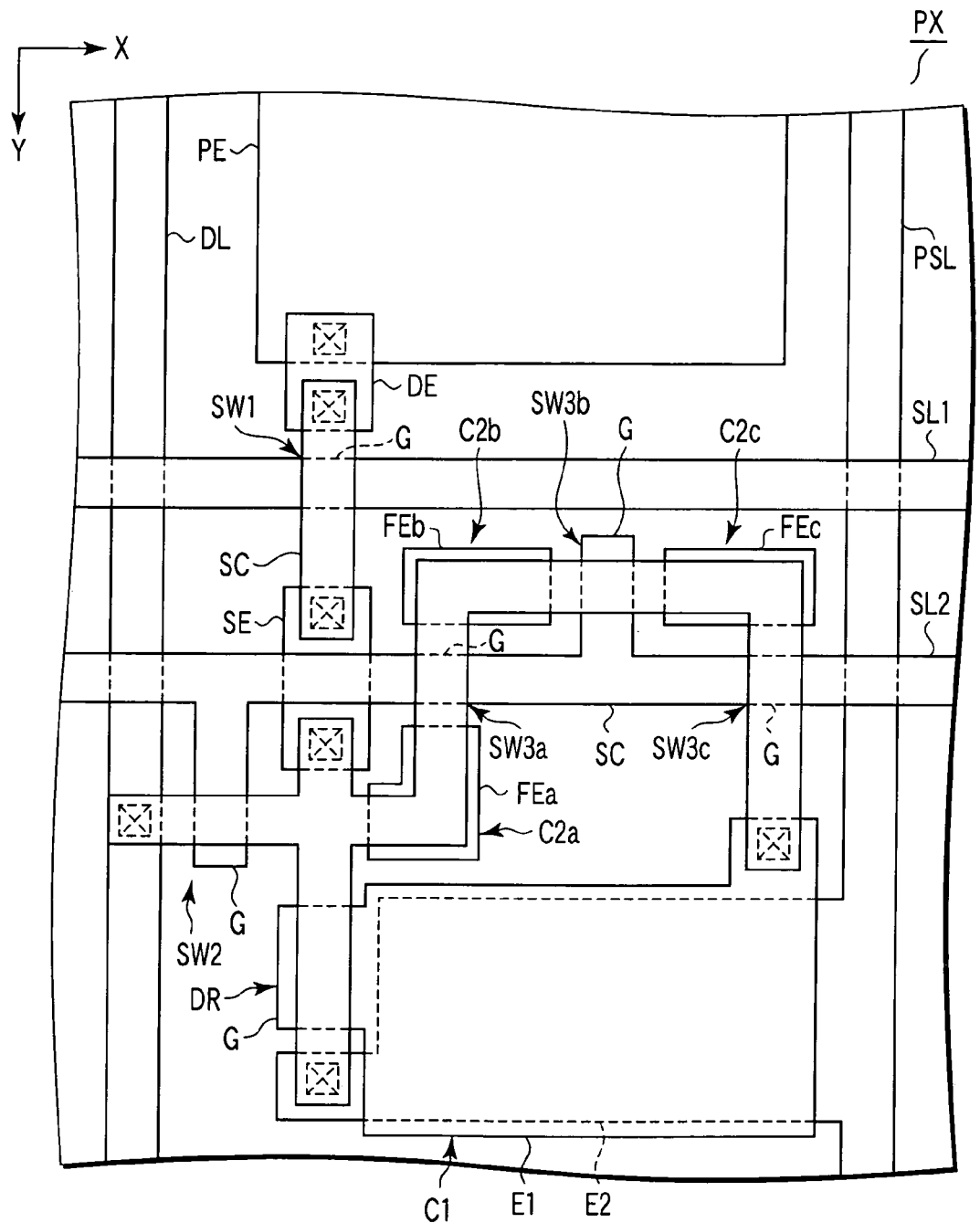
FIG. 4 is a plan view schematically showing an example of a structure that can be used in pixels of the display shown in FIG. 1.

FIG. 1 is a plan view schematically showing an example of a display including an array substrate according to a first embodiment of the present invention. FIG. 2 is a partial sectional view schematically showing an example of a structure that can be used in the display shown in FIG. 1. FIG. 3 is an equivalent circuit diagram of a pixel included in the display shown in FIG. 1. FIG. 4 is a plan view schematically showing an example of a structure that can be used in pixels of the display shown in FIG. 1.

In FIG. 2, the display is drawn such that its display surface, that is, its front surface or light emitting surface faces the bottom of the drawing, while its rear surface faces the top of the drawing. FIG. 4 shows the structure of the pixel viewed from the side of the front surface.

The display is a bottom emission organic EL display employing an active matrix driving method. The organic EL display includes an insulating substrate SUB such as a glass substrate.

As an undercoat layer UC shown in FIG. 2, for example, an $SiN_x$ layer and an $SiO_x$ layer are sequentially stacked on the substrate SUB.

Semiconductor layers SC such as polysilicon layers in each of which source and drain are formed, a gate insulator GI which may be formed by using tetraethyl orthosilicate (TEOS), and gates G which are made of, for example, MoW are sequentially stacked on the undercoat layer UC to form top gate-type thin-film transistors. In this embodiment, the thin-film transistors are p-channel thin-film transistors and utilized as drive transistors DR and switches (or switching elements) SW1, SW2, and SW3a to SW3c shown in FIGS. 1, 3 and 4.

Parts of the semiconductor layers SC of the switching elements SW3a to SW3c corresponding to the sources are utilized as bottom electrodes of capacitors C2a to C2c described later. Parts of the gate insulator GI on the bottom electrodes are utilized as dielectric layers of the capacitors C2a to C2c.

Scan signal lines SL1 and SL2 shown in FIGS. 1, 3 and 4 and electrodes E1 and FEa to FEc are further arranged on the gate insulator GI. These components can be formed in the same step as that for the gates G.

As shown in FIG. 1, the scan signal lines SL1 and SL2 extend along the rows of the pixels PX, i.e., in an X direction, and are arranged in a Y direction along the columns of the pixels PX. The scan signal lines SL1 and SL2 are connected to a scan signal line driver YDR.

The electrodes E1 are connected to the gates of the drive transistors DR, respectively. The electrodes E1 are used as bottom electrodes of capacitors C1 described later.

The electrodes FEa to FEc are in a floating state. The floating electrodes FEa to FEc are used as the top electrodes of the capacitors C2a to C2c, respectively.

An interlayer insulating film II shown in FIG. 2 covers the gate insulator GI, the gates G, the scan signal lines SL1 and SL2, and the electrodes E1 and FEa to FEc. The interlayer insulating film II is, for example, an $SiO_x$ layer formed by plasma CVD. Parts of the interlayer insulating film II on the electrodes E1 are utilized as dielectric layers of the capacitors C1.

On the interlayer insulating film II, source electrodes SE and drain electrodes DE shown in FIGS. 2 and 4, video signal lines DL and power supply lines PSL shown in FIGS. 1, 3 and 4, and electrodes E2 shown in FIG. 4 are arranged. These components can be formed in the same step and may have a three-layer structure of, for example, Mo, Al, and Mo.

The source electrode SE and drain electrode DE are electrically connected to source and drain of the thin-film transistors via contact holes formed in the interlayer insulting film II.

As shown in FIG. 1, the video signal lines DL extend in the Y direction and are arranged in the X direction. The video signal lines DL are connected to a video signal line driver XDR.

The power supply lines PSL extend in the Y direction and are arranged in the X direction, for example.

The electrodes E2 are connected to the power supply line PLS. The electrodes E2 are used as the top electrodes of the capacitors C1.

A passivation film PS shown in FIG. 2 covers the source electrodes SE, drain electrodes DE, video signal lines DL, power supply lines PSL, and electrodes E2. The passivation film PS is made of, for example, $SiN_x$.

As shown in FIG. 2, light-transmissive first electrodes PE as front electrodes are arranged on the passivation film PS such that they are spaced apart from one another. Each of the first electrodes PE is a pixel electrode connected through a through-hole formed in the passivation film PS to the drain electrode DE to which the drain of the switch SWa is connected.

In this embodiment, the first electrodes PE are anodes. A transparent conductive oxide, for example, indium tin oxide (ITO) can be used as a material of the first electrodes PE.

A partition insulating layer PI shown in FIG. 2 is further placed on the passivation film PS. The partition insulating layer PI has through-holes formed at positions corresponding to the first electrodes PE or slits formed at positions corresponding to columns or rows formed by the first electrodes PE. Here, by way of example, the partition insulating layer PI has through-holes formed at positions corresponding to the first electrodes PE.

The partition insulating layer PI is, for example, an organic insulating layer. The partition insulating layer PI can be formed using, for example, a photolithography technique.

An organic layer ORG including an emitting layer is placed on each of the first electrodes PE as an active layer. The emitting layer is, for example, a thin film containing a luminescent organic compound that emits red, green, or blue light. In addition to the emitting layer, the organic layer ORG may include a hole injection layer, a hole transporting layer, a hole blocking layer, an electron transporting layer, and an electron injection layer.

The partition insulating layer PI and the organic layer ORG are covered with a second electrode CE as a counter electrode. The second electrode CE is a common electrode shared among the pixels PX. In this embodiment, the second electrode CE is a light-reflective cathode serving as a back electrode. For example, an electrode wire (not shown) is formed on the layer on which the video signal lines DL are formed, and the second electrode CE is electrically connected to the electrode wire via a contact hole formed in the passivation film PS and partition insulating layer PI. Each organic EL element OLED is composed of the first electrode PE, organic layer ORG, and second electrode CE.

The pixels PX are arranged in a matrix on the insulating substrate SUB. Each of the pixels PX is placed near an intersection of the video signal line DL and scan signal line SL1.

In this embodiment, each pixel PX includes the organic EL element OLED as a display element, the drive transistor DR, the output control switch SW1, the selector switch SW2, the switching elements SW3a to SW3c, and the capacitors C1 and C2a to C2c as shown in FIGS. 1, 3 and 4. The pixel electrode PE of the organic EL element OLED, the output control switch SW1, the selector switch SW2, the switching elements SW3a to SW3c, and the capacitors C1 and C2a to C2c form a pixel circuit.

As described above, in this embodiment, the drive transistor DR, The switches SW1 and SW2, and switching elements SW3a to SW3c are p-channel thin-film transistors. The switching elements SW3a to SW3c form a diode-connecting switch SW3. The selector switch SW2 and the diode-connecting switch SW3 form a switch group which switches between a first state that the drain and gate of the drive transistor DR and the video signal line DL are connected to one another and a second state they are disconnected from one another.

The drive transistor DR, the output control switch SWa, and the organic EL element OLED are connected in series between a first power supply terminal ND1 and a second power supply terminal ND2 in this order. In this embodiment, the first power supply terminal ND1 is a high-potential power supply terminal, and the second power supply terminal ND2 is a low-potential power supply terminal.

The gate of the drive current supply control switch SW1 is connected to the scan signal line SL1. The selector switch SW2 is connected between the video signal line DL and the drain of the drive transistor DRT. The gate of the selector switch SW2 is connected to the scan signal line SL2. The switching elements SW3a to SW3c are connected in series between the drain and gate of the drive transistor DR in this order. The gates of the switching elements SW3a to SW3c are connected to the scan signal line SL2.

The capacitor C1 is connected between a constant-potential terminal ND1' and the gate of the drive transistor DR. One electrode of the capacitor C2a is connected to the source of the switching element SW3a, and another electrode of the capacitor C2a is in a floating state. One electrode of the capacitor C2b is connected to the source of the switching element SW3b, and another electrode of the capacitor C2b is in a floating state. One electrode of the capacitor C2c is connected to the source of the switching element SW3c, and another electrode of the capacitor C2c is in a floating state.

Note that an array substrate corresponds to a structure in which the video signal line driver XDR, the scan signal line driver YDR, the organic layer ORG and the second electrode CE are omitted from the organic EL display, or a structure in which the video signal line driver XDR, the scan signal line driver YDR, the partition insulating layer PI, the organic layer ORG and the second electrode CE are omitted from the organic EL display. The array substrate may include the video signal line driver XDR and/or the scan signal line driver YDR.

When an image is to be displayed on the organic EL display, for example, the scan signal lines SL1 and the scan signal lines SL2 are scanned sequentially. During a write period in which a video signal is to be written on a certain pixel PX, firstly, the scan signal line driver YDR outputs a scan signal as a voltage signal to the scan signal line SL1 to which the above pixel is connected so as to open the switch SW1 in the pixel. Subsequently, the scan signal line driver YDR outputs a scan signal as a voltage signal to the scan signal line SL2 to which the above pixel PX is connected so as to close the switch SW2 and switching elements SW3a to SW3c. In this state, the video signal line driver XDR outputs a video signal as a current signal to the video signal line DL to which the above pixel PX is connected so as to set the gate-to-source voltage of the drive transistor DR at a magnitude corresponding to the magnitude of the video signal. Thereafter, the scan signal line driver YDR outputs a scan signal as a voltage signal to the scan signal line SL2 to which the above pixel PX is connected so as to open the switch SW2 and the switching elements SW3a to SW3c, and then, outputs a scan signal as a voltage signal to the scan signal line SL1 to which the above pixel PX is connected so as to close the switch SW1.

During an effective display period over which the switch SW1 is opened, a drive current flows through the organic EL element OLED at a magnitude corresponding to the gate-to-source voltage of the drive transistor DR. The organic EL element emits light at a luminance corresponding to the magnitude of the drive current.

The semiconductor layers of the thin-film transistors are not covered with the counter electrode after forming the pixel electrode and before completing the organic EL elements. Thus, for example, when an evaporation mask made of metal is brought near to the array substrate, the semiconductor layers and the evaporation mask form capacitors to shift the potentials of the source and drain of each thin-film transistor. When the potentials greatly change, a large voltage may be applied between the gate and the source or drain of each thin-film transistor to short-circuit them. This is one of the reasons why thin-film transistors suffer electrostatic damage.

In the present embodiment, the bottom electrodes of the capacitors C2a to C2c are connected to the source and/or drain of the thin-film transistors, and the top electrodes of the capacitors C2a to C2c are in a floating state. Thus, when an evaporation mask made of metal is brought near to the array substrate, a large potential shift does not occur at those portions of the semiconductor layers connected to the bottom electrodes of the capacitors C2a to C2c and in the vicinity thereof. Therefore, it is possible to prevent a large voltage from being applied between the gate and the source or drain of each thin-film transistor. Consequently, a short-circuit of them cam be suppressed.

The capacitance of each of the capacitors C2a to C2c is, for example, between 0.01 and 0.1 pF. When the capacitance is too small, the above effect may not be sufficiently produced. When the capacitance is too large, writing a video signal in a short time may be difficult.

In the present embodiment, the three switching elements SW3a to SW3c are connected in series between the drain and gate of the drive transistor DR. The number of switching elements connected between the drain and gate of the drive transistor DR is not limited.

In the present embodiment, one electrode of the capacitor C2a, one electrode of the capacitor C2b, and one electrode of the capacitor C2c are connected to the sources of the switching elements SW3a to SW3c. However, these electrodes may be connected to the sources and/or drains of other thin-film transistors. Further, in the present embodiment, as a capacitor that includes an electrode connected to a source or drain of a thin-film transistor and an electrode in a floating state, three capacitors C2a to C2c are arranged for one pixel PX. The number of the capacitors arranged in the pixel PX is not limited.

In the present embodiment, the organic EL display is of a bottom emission display. The organic EL display may be a top emission display. Further, in the present embodiment, the circuit shown in FIG. 3 is used in the pixel PX. Alternatively, another circuit may be used in the pixel PX. For example, the pixel PX may include a circuit using a voltage signal as a video signal instead of the circuit using a current signal as a video signal.

A second embodiment of the present invention will be described below.

Figure 5:
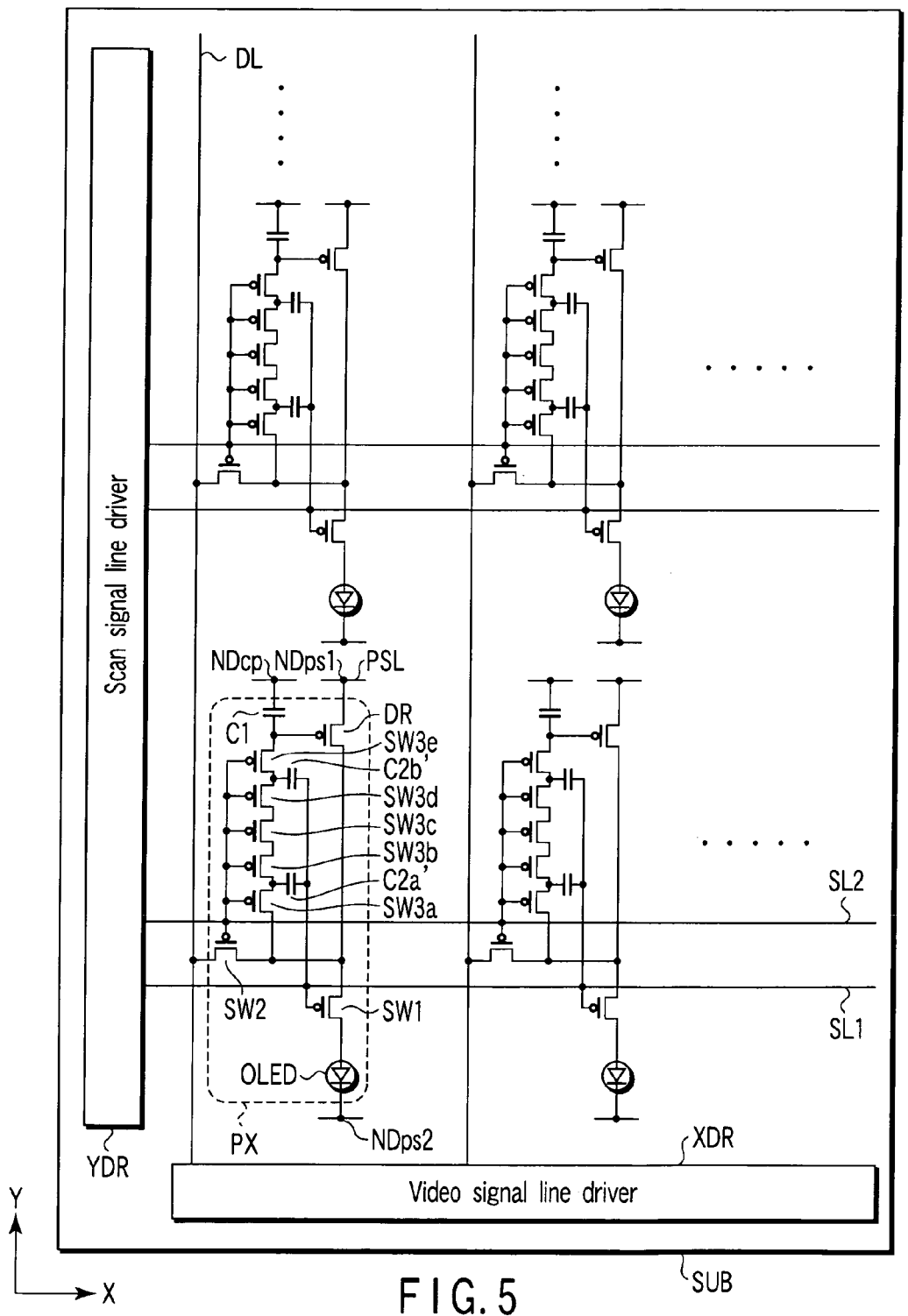
FIG. 5 is a plan view schematically showing an example of a display including an array substrate according to a second embodiment of the present invention.
Figure 6:
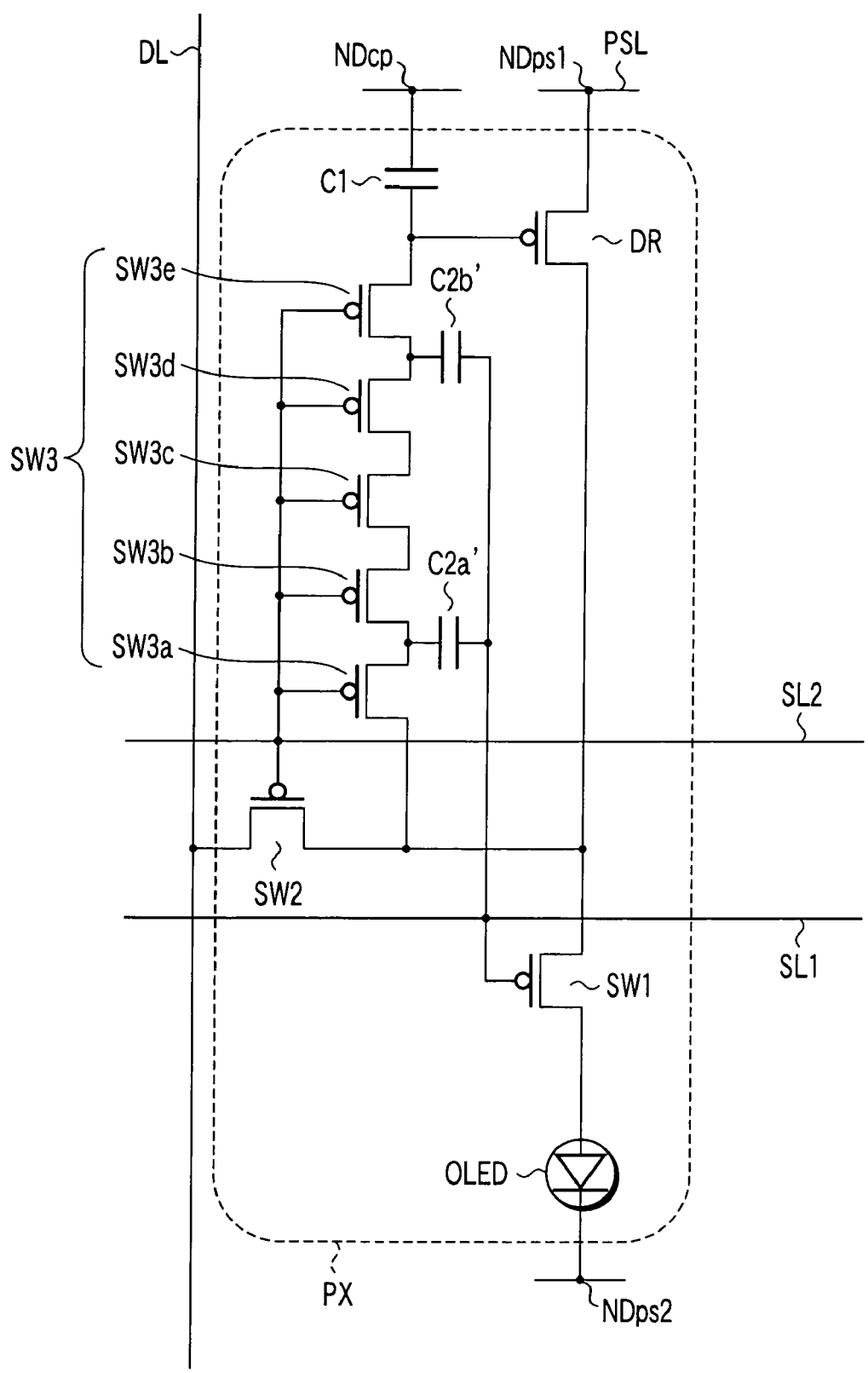
FIG. 6 is an equivalent circuit diagram of a pixel included in the display in FIG. 5.
Figure 7:
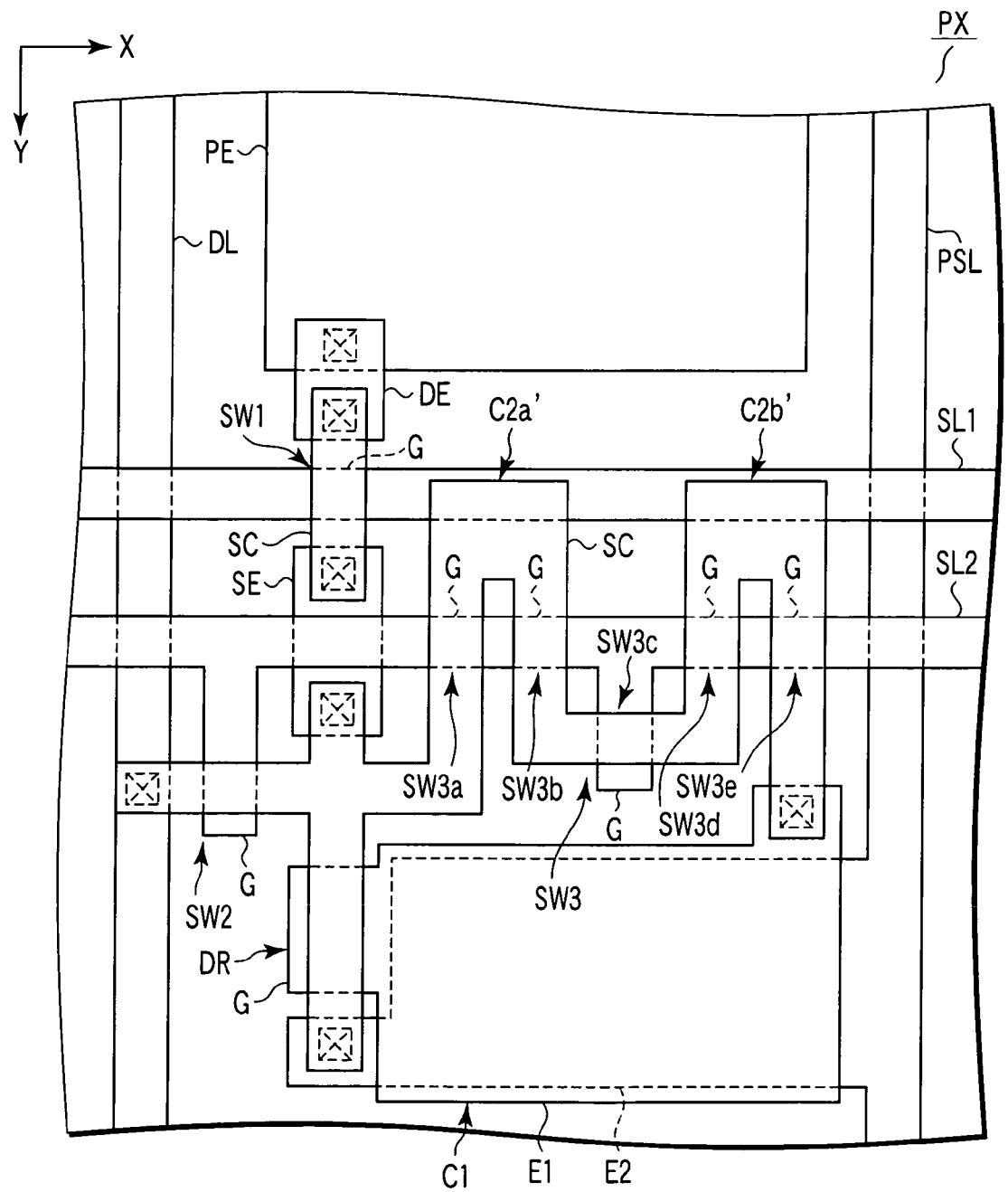
FIG. 7 is a plan view schematically showing an example of a structure that can be used in the pixels of the display shown in FIG. 5.

FIG. 5 is a plan view schematically showing an example of a display including an array substrate according to a second embodiment of the present invention. FIG. 6 is an equivalent circuit diagram of a pixel included in the display in FIG. 5. FIG. 7 is a plan view schematically showing an example of a structure that can be used in the pixels of the display shown in FIG. 5.

FIG. 7 shows the structure of the pixel viewed from the side of the front surface. The sectional structure of the display is similar to that described with reference to FIGS. 1 and 2.

The display is a bottom emission organic EL display employing an active matrix driving method. The display has a structure similar to that of the display according to the first embodiment except that the following structure is employed.

The diode-connecting switch SW3 includes switching elements SW3d and SW3e in addition to the switching elements SW3a to SW3c. In this embodiment, the switching elements are p-channel thin-film transistors. The switching elements SW3a to SW3e are connected in series between the drain and gate of the drive transistor DR in this order. The gates of the switching elements SW3a to SW3e are connected to the scan signal line SL2.

Unlike the pixel PX shown in FIGS. 1 and 3, each pixel PX does not includes the electrodes FEa to FEc. Instead, parts of the semiconductor layer SC corresponding the drains of the switching elements SW3a and SW3d face the scan signal line SL1 with the gate insulator GI interposed therebetween. The drain of the switching element SW3a, the scan signal line SL1, and the gate insulator GI interposed between them form a capacitor C2a'. The drain of the switching element SW3d, the scan signal line SL1, and the gate insulator GI interposed between them form a capacitor C2b'.

That is, each pixel PX includes the capacitors C2a' and C2b' instead of the capacitors C2a and C2b. The capacitor C2a' is connected between the drain of the switching element SW3a and the scan signal line SL1. The capacitor C2b' is connected between the drain of the switching element SW3d and the scan signal line SL1.

The display can be driven by, for example, the same method as described in the first embodiment.

When the conventional pixel employs a structure that the diode-connecting switch includes a plurality of switching elements connected in series, electrostatic damage is easy to occur to the switching elements of the diode-connecting switch and the like. The pixel whose switching element suffers electrostatic damage may be viewed as a luminous dot or dark dot.

The present inventors examined this phenomenon in detail. As a result, the inventors have found the following fact.

The semiconductor layer of the thin-film transistor is not covered with the counter electrode after the pixel electrode is formed and before the organic EL element is completed. The semiconductor layer, thus, forms a capacitor when, for example, an evaporation mask made of metal is brought near to the array substrate. This shifts the potentials of the source and drain of each thin-film transistor.

The potential shift is not significant at a position of the semiconductor layer where it forms a capacitor having a large capacitance with the wiring and the like or where it is connected to a capacitor having a large capacitance, or in the vicinity of the position. When the potential shift is small, a large voltage is not applied between the source or drain and the gate of the thin-film transistor, and therefore, a short-circuit of them is less prone to occur.

However, when simply connecting a plurality of switching elements in series in the conventional pixel circuit, the semiconductor layer of the switching elements neither forms a capacitor having a large capacitance with the wiring and the like nor is connected to a capacitor having a large capacitance. Thus, a large voltage is applied between the source or drain and the gate of the thin-film transistor, and therefore, a short-circuit of them is prone to occur.

In this embodiment, the capacitor C2a' is connected between the drain of the switching element SW3a and the scan signal line SL1, and the capacitor C2b' is connected between the drain of the switching element SW3d and the scan signal line SL1. Consequently, it can be possible to sufficiently suppress the above potential shift. Therefore, according to the present embodiment, it is possible to prevent a high voltage from being applied between the source or drain and the gate of the switching elements SW3a to SW3e. That is, the switching elements SW3a to SW3e can be protected from electrostatic damage.

The capacitance of each of the capacitors C2a' and C2b' is, for example, between 0.01 and 0.1 pF. When the capacitor C2a' and/or capacitor C2b' has too small a capacitance, the above effect may not be sufficiently produced. When the capacitor C2a' and/or capacitor C2b' has too large a capacitance, the rise of the scan signal may be delayed.

In the present embodiment, the diode-connecting switch SW3 includes five switching elements SW3a to SW3e. The number of switching elements included in the diode-connecting switch SW3 is not limited provided that it is at least two. In the present embodiment, the organic EL display is a bottom emission display. Alternatively, it may be a top emission display.

A third embodiment of the present invention will be described below.

Figure 8:
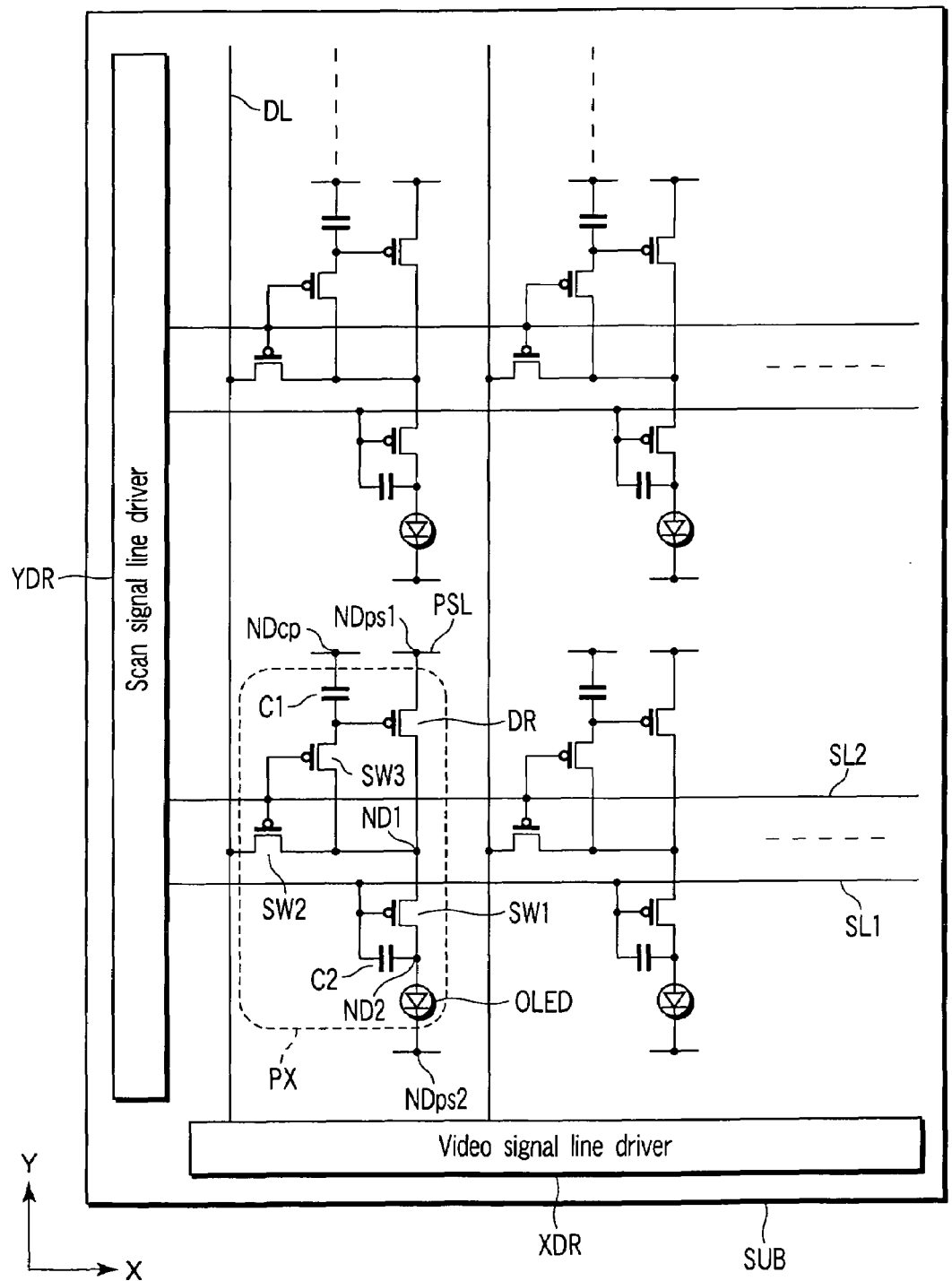
FIG. 8 is a plan view schematically showing an example of a display including an array substrate according to a third embodiment of the present invention.
Figure 10:
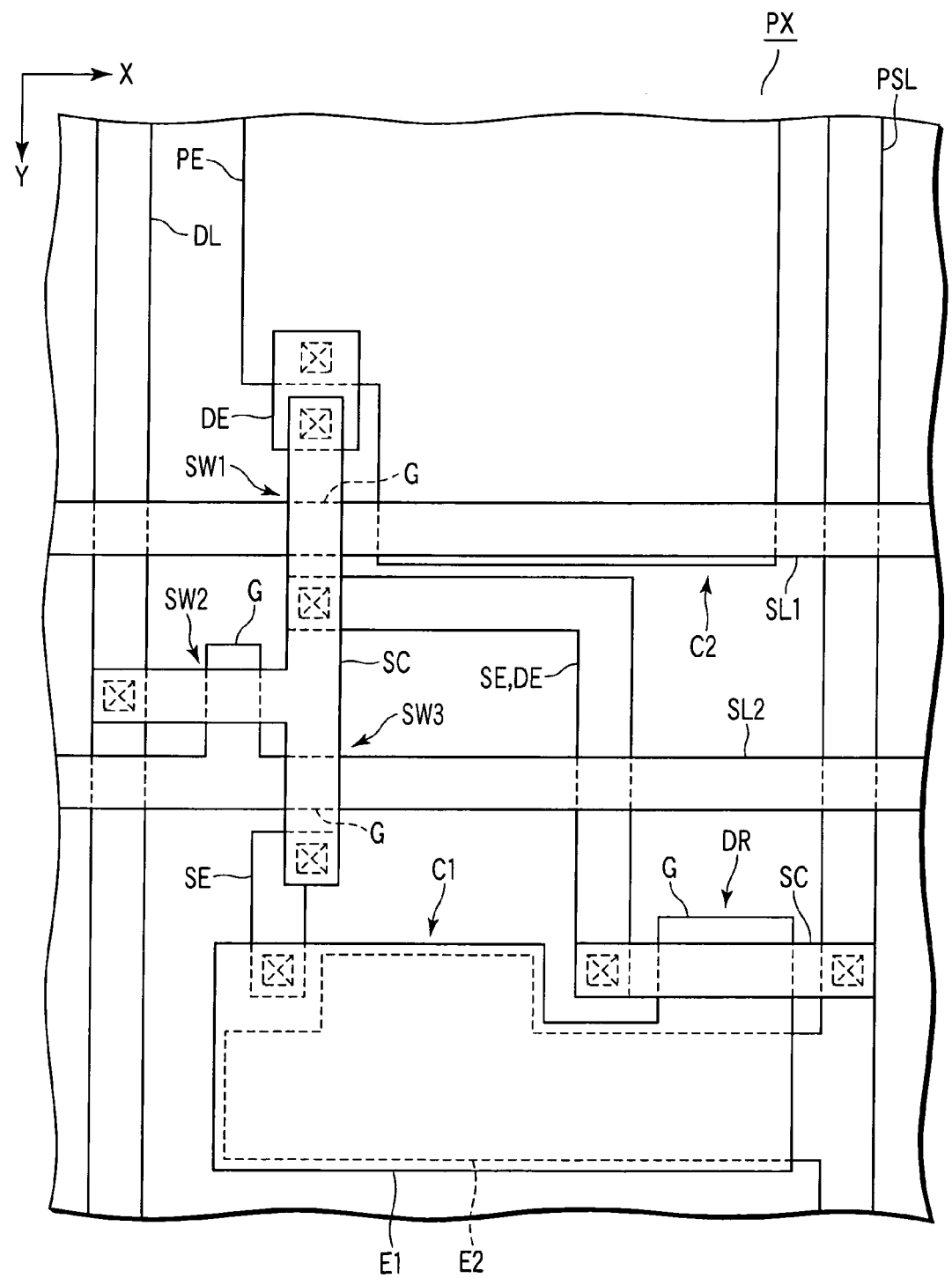
FIG. 10 is a plan view schematically showing an example of a structure that can be used in the pixels included in the display shown in FIG. 8.

FIG. 8 is a plan view schematically showing an example of a display including an array substrate according to a third embodiment of the present invention. FIG. 9 is an equivalent circuit diagram of a pixel included in the display shown in FIG. 8. FIG. 10 is a plan view schematically showing an example of a structure that can be used in the pixels included in the display shown in FIG. 8.

FIG. 10 shows the structure of the pixel viewed from the side of the front surface. The sectional structure of the display is similar to that described with reference to FIGS. 1 and 2.

The display is a bottom emission organic EL display employing an active matrix driving method. The display has a structure similar to that of the display according to the first embodiment except that the following structure is employed.

Each pixel PX one switching element includes as a diode-connecting switch SW3 instead of the switching elements SW3a to SW3c. In this embodiment, the switch SW3 is a p-channel thin-film transistor. The switch SW3 is connected between the drain and gate of the drive transistor DR. The gate of the switch SW3 is connected to the scan signal line SL2.

Unlike the pixel PX shown in FIGS. 1 and 3, each pixel PX does not include the electrodes FEa to FEc. That is, each pixel PX does not the capacitors C2a to C2c shown in FIGS. 1 and 3.

Instead, in each pixel PX, the pixel electrode PE faces the scan signal line SL1 with the interlayer insulating film II and the passivation film PS interposed therebetween. The pixel electrode PE, the scan signal line SL1, and parts of the interlayer insulating film II and the passivation film PS form a capacitor C2. That is, each pixel PX includes the capacitor C2 instead of the capacitors C2a to C2c. The capacitor C is connected between the drain and gate of the switch SW1.

Conventionally, the output control switch is prone to suffer electrostatic damage after forming the first electrode PE and before completing the organic EL element OLED. The pixel whose output control switch SW1 suffering electrostatic damage may be viewed as a luminous dot.

As a result of studying the phenomenon in detail, the following fact has found.

The first electrode PE is not covered with the counter electrode after the pixel electrode is formed and before the organic EL element is completed. The first electrode PE, thus, forms a capacitor when, for example, an evaporation mask made of metal is brought near to the array substrate. This shifts the potential of the drain of the output control switch SW1. Consequently, in the conventional array substrate, a large voltage is applied between the drain of the output control switch SW1 and the scan signal line SL1, and therefore, a short-circuit of them is prone to occur.

In this embodiment, since one electrode of the capacitor C2 is connected to the drain of the output control switch SW1, the potential shift is less prone to occur. In addition, since another electrode of the capacitor C2 is connected to the gate of the output control switch SW1. the gate potential of the output control switch SW1 changes correspondently with the change in drain potential of the output control switch SW1. Therefore, according to the present embodiment, it is possible to prevent a high voltage from being applied between the drain of the output control switch SW1 and the scan signal line SL1. That is, the output control switch SW1 can be protected from electrostatic damage.

The capacitance of the capacitor C2 is, for example, between 0.01 and 0.1 pF. When the capacitor C2 has too small a capacitance, the above effect may not be sufficiently produced. When the capacitor C2 has too large a capacitance, the rise and/or fall of the scan signal may be delayed.

Typically, the first electrode PE is placed not to overlap the scan signal line SL2, the video signal line DL, the power supply line PSL, the drive transistor DR, the switches SW1 to SW3, and the capacitor C1, when viewed perpendicularly to the main surface of the insulating substrate. In addition, typically, the first electrode PE is placed to overlap only one of the scan signal lines SL1 to which the pixel PX including the above first pixel PE is connected. According to this structure, a delay of signals is prevented without adversely affecting the operation of the transistors.

The capacitor C2 may be formed of the first electrode PE and the scan signal line SL1 as shown in FIG. 10. Alternatively, the capacitor C2 may be formed of other components. For example, the drain electrode DE connecting the output control switch SW1 to the first electrode PE may be designed such that the drain electrode DE faces the scan signal line SL1. In this case, the drain electrode DE and the scan signal line SL1 can be used as the electrodes of the capacitor C2.

In the present embodiment, the diode-connecting switch SW3 of each pixel PX includes one switching element. Alternatively, the diode-connecting switch SW3 may two or more switching elements as the first and second embodiments. In the present embodiment, the organic EL display is a bottom emission display. Alternatively, it may be a top emission display. In this embodiment the pixel PX employs the circuit shown in FIG. 3. The pixel PX may employ other circuits. For example, the pixel PX may employ a circuit which uses a voltage as the video signal instead of the circuit which uses a current signal as the video signal.

The techniques described in the first to third embodiments can be utilized in combination. For example, the pixel PX shown in FIGS. 1, 3 and 4 may be further includes the capacitors C2a' and C2b' shown in FIGS. 5 to 7, or the capacitor C2 shown in FIGS. 8 to 10, or the capacitors C2, C2a' ad C2b'. Likewise, the pixel PX may further includes the capacitor C2 shown in FIGS. 8 to 10.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An array substrate comprising an insulating substrate, pixel circuits arranged in a matrix on the insulating substrate, and video signal lines arranged correspondently with columns which the pixel circuits form, each of the pixel circuits comprising:
    a drive transistor whose source is connected to a power supply terminal;
    a pixel electrode;
    an output control switch connected between a drain of the drive transistor and the pixel electrode;
    a selector switch connected between the drain and the video signal line;
    a diode-connecting switch including switching elements connected in series between the drain and a gate of the drive transistor;
    a first capacitor including an electrode connected to the gate; and
    a second capacitor including a first electrode to which two of the switching elements are connected in parallel.

2. The array substrate according to claim 1, further comprising scan signal lines arranged correspondently with rows which the pixel circuits form, wherein, in each of the pixel circuits, the output control switch includes a switching transistor whose gate is connected to the scan signal line, and the second capacitor further includes a second electrode which faces the first electrode and is connected to the scan signal line.

3. The array substrate according to claim 2, wherein the second electrode is a polysilicon layer.

4. The array substrate according to claim 1, wherein the second capacitor further includes a floating electrode as a second electrode which faces the first electrode.

5. The array substrate according to claim 4, wherein the floating electrode is a metallic layer.

6. An array substrate comprising an insulating substrate, pixel circuits arranged in a matrix on the insulating substrate, and video signal lines arranged correspondently with columns which the pixel circuits form, each of the pixel circuits comprising:
 a drive transistor whose source is connected to a power supply terminal;
 a pixel electrode;
 an output control switch connected between a drain of the drive transistor and the pixel electrode;
 a selector switch connected between the drain and the video signal line;
 a diode-connecting switch including switching elements connected in series between the drain and a gate of the drive transistor; and
 a capacitor including an electrode connected to the gate,
 wherein, when the array substrate is observed perpendicularly to a main surface of the insulating substrate, a conductive path connecting the drain to the gate of the drive transistor partially overlaps a conductive layer in each of the pixel circuits.

7. The array substrate according to claim 6, further comprising scan signal lines arranged correspondently with rows which the pixel circuits form, wherein, in each of the pixel circuits, the output control switch includes a switching transistor whose gate is connected to the scan signal line, and the conductive layer is a part of the scan signal line.

8. The array substrate according to claim 7, wherein the conductive layer is a polysilicon layer.

9. The array substrate according to claim 6, wherein the conductive layer is a floating electrode.

10. The array substrate according to claim 9, wherein the floating electrode is a metallic layer.

11. An array substrate comprising an insulating substrate, pixel circuits arranged in a matrix on the insulating substrate, and video signal lines arranged correspondently with columns which the pixel circuits form, each of the pixel circuits comprising:
 a drive transistor whose source is connected to a power supply terminal;
 a pixel electrode;
 an output control switch connected between a drain of the drive transistor and the pixel electrode and including a switching transistor;
 a selector switch connected between the drain and the video signal line;
 a diode-connecting switch connected between the drain and a gate of the drive transistor;
 a first capacitor including an electrode connected to the gate; and
 a second capacitor connected between the pixel electrode and a gate of the switching transistor.

12. The array substrate according to claim 11, wherein the second capacitor includes a first electrode connected to the gate of the switching transistor, and a second electrode facing the first electrode and connected to the pixel electrode, a material of the first electrode being the same as a material of the gate of the switching transistor, and a material of the second electrode being the same as a material of the pixel electrode.

13. An array substrate comprising an insulating substrate, pixel circuits arranged in a matrix on the insulating substrate, scan signal lines arranged correspondently with rows which the pixel circuits form, and video signal lines arranged correspondently with columns which the pixel circuits form, each of the pixel circuits comprising:
 a drive transistor whose source is connected to a power supply terminal;
 a pixel electrode;
 an output control switch connected between a drain of the drive transistor and the pixel electrode and including a switching transistor whose gate is connected to the scan signal line;
 a selector switch connected between the drain and the video signal line;
 a diode-connecting switch connected between the drain and a gate of the drive transistor; and
 a capacitor including an electrode connected to the gate,
 wherein, when the array substrate is observed perpendicularly to a main surface of the insulating substrate, the pixel electrode partially overlaps the scan signal line in each of the pixel circuits.

14. The array substrate according to claim 13, further comprising power supply lines connected to the power supply terminal, wherein, when the array substrate is observed perpendicularly to the main surface of the insulating substrate, the pixel electrode partially overlaps only the scan signal line among the scan signal lines, the video signal lines, and the power supply lines in each of the pixels.

* * * * *